US006564115B1

(12) United States Patent
Kinnaird

(10) Patent No.: US 6,564,115 B1
(45) Date of Patent: May 13, 2003

(54) COMBINED SYSTEM, METHOD AND APPARATUS FOR WIRE BONDING AND TESTING

(75) Inventor: Clark Kinnaird, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/496,122

(22) Filed: Feb. 1, 2000

(51) Int. Cl.$^7$ ............................................. H01L 21/60
(52) U.S. Cl. ...................... 700/121; 219/56.1; 228/1.1
(58) Field of Search ...................... 438/14, 50, 617; 228/180.5, 4.5, 1.1, 104; 219/56.1; 700/109–110, 121, 117, 212, 59; 702/42; 73/827

(56) References Cited

U.S. PATENT DOCUMENTS

| | | | | |
|---|---|---|---|---|
| 4,571,688 A | * | 2/1986 | Kashihara et al. | 700/212 |
| 4,976,392 A | * | 12/1990 | Smith et al. | 228/102 |
| 5,894,981 A | * | 4/1999 | Kelly | 228/180.5 |
| 6,078,387 A | * | 6/2000 | Sykes | 356/244 |

* cited by examiner

Primary Examiner—Leo Picard
Assistant Examiner—Alexander Kosowski
(74) Attorney, Agent, or Firm—Michael K. Skrehot; Wade James Brady, III; Frederick J. Telecky, Jr.

(57) ABSTRACT

A combined system and method for computer-controlled bonding and testing of wire connections between integrated circuit chips and substrates, and for automatically adjusting the bonding parameters in response to said testing, comprising the steps of forming a wire connection between said chip and said substrate under computer control to create wire attachments and a wire span; testing said wire connection automatically under computer control to generate test data; and automatically adjusting the bonding parameters of subsequent wire connections responsive to said test data, whereby the number of faulty bonds is reduced to near zero and bonding production downtime is substantially eliminated.

29 Claims, 5 Drawing Sheets

US 6,564,115 B1

COMBINED SYSTEM, METHOD AND APPARATUS FOR WIRE BONDING AND TESTING

FIELD OF THE INVENTION

The present invention is related in general to the field of electronic systems and semiconductor devices and more specifically to combined automated systems, methods and apparatus for wire bonding to semiconductor chips and quality testing.

DESCRIPTION OF THE RELATED ART

The inputs/output pads of integrated circuit chips are conventionally connected to the outside world by metal wires forming a span. The metal of the input/output pads typically consists of aluminum or copper, and as wire materials gold or copper are typically used. In most semiconductor devices, a capillary is used to attach the one end of the connecting wire (for instance, gold) to the pad metal in form of a flattened ball. Elevated temperature, ultrasonic energy, mechanical pressure and bonding time need to be carefully controlled to create a high-quality weld; in the example of gold ball onto aluminum metal, this weld consists of a consecutive series of five gold-aluminum intermetallics, which need to be rapidly initiated in the short period of bonding time (between 5 and 20 ms).

The other end of the connecting wire is attached to a metal surface by the capillary in form of a stitch bond. In many semiconductor devices, the metal surface consists of a silver flash deposited onto a copper-base leadframe, and the wire stitch is formed at elevated temperatures and mechanical pressure (range about 5 to 20 ms) so that intermetallic diffusion can take place. Similar metal interdiffusion creates the bond when a wedge-shaped tool is used instead of a capillary to form wedge bonds.

The operation of wire bonding is performed by automated, computer-controlled bonders, commonly combined with vision systems. They allow setting and controlling of bonding parameters such as geometrical positioning, impact velocity and contact force of bonding tool and dwell time and ultrasonic energy during bond formation. In spite of these controls, the quality of the bonds is sometimes marginal or outright poor. In most instances, the root cause is an unnoticed variation of the metal-to-be-bonded (for instance, crystallinity or hardness) or an insufficiently clean metal surface (for example, undetected oxidation, organic residue, or particulate contamination) Quality tests have, therefore, been developed during the last decade which aim at identifying poor bond quality or run-away processes as early as possible.

The most important and routinely performed tests are the pulling of the wire spans to the wire break point, and the shearing of the wire attachments, especially ball bonds, to the shear-off point. In both of these tests, the required forces are measured; the tests are destructive and have to be performed off-line, but are relatively fast. Other tests are much more cumbersome and time consuming; these tests include chemical etching of metal surfaces or metallurgical cross sections, surface Auger analysis, or Knoop metal hardness analysis. Of course, all of these tests are destructive and off-line.

SUMMARY OF THE INVENTION

According to the present invention for semiconductor integrated circuit (IC) assembly, the two operations of wire bonding and wire quality testing are combined into one computer-controlled system, in which one tool head performs first the bonding operation and then on-line the testing operation, and finally implements any corrections based on the test results in real-time feedback into the bonding parameters, before continuing with the bonding processes. Based on the invention, the number of faulty bonds is reduced to near zero, and the bonding production downtime due to off-line testing is substantially eliminated.

The present invention is related to high density ICs, especially those having high numbers of inputs/outputs, or bonding pads, further to devices using metallic leadframes as well as to chips being mounted on insulating substrates, and also to devices requiring small package outlines and low profiles. These ICs can be found in many semiconductor device families such as processors, digital and analog devices, standard linear and logic products, memories, high frequency and high power devices, and both large and small area chip categories. The invention helps to insure built-in quality and reliability in applications such as cellular communications, pagers, hard disk drives, laptop computers and medical instrumentation.

The invention utilizes the materials and basic process steps commonly practiced in wire bonding technology, both for ball bonding and wedge bonding variations. However, the bonding process is modified such that test data can be taken after completing only few yet statistically meaningful numbers of bonds. The test data is evaluated real-time, automatically converted to potential corrections of the bonding parameters, and fed back to the bonder. In this fashion, improved characteristics of all subsequent bonds are automatically implemented.

It is an aspect of the present invention to provide a technology for combining the wire bonding and the wire testing operations in semiconductor assembly which is fully automatic and does not require additional equipment space for the bonder machines. The aspect is achieved by adding a computer-controlled tool in proximity to the bond head which is designed to perform the wire pulling and bond pushing quality tests and to record the required forces.

Another aspect of the invention is to reach these goals while keeping the cost of equipment change to a minimum and using the installed fabrication equipment base so that no new capital investment is needed.

Another aspect of the present invention is to provide real-time feedback of the testing results so that the bonding parameters can be corrected for improving the bond quality without significant bonder downtime. The aspect is achieved by converting the test data automatically into bonding parameters, with direct feedback to the bonder.

Another aspect of the present invention is to provide flexibility to the bonding process in order to accept variations in the chip metallization such as variable crystallinity, oxide formation, and at least some accidental impurities.

Another aspect of the present invention is to introduce assembly concepts which are flexible so that they can be applied to ball bonding as well as to wedge bonding technologies, and to many families of semiconductor IC products, and are further general so that they can be applied to several future generations of products.

These aspects have been achieved by the teachings of the invention concerning system and apparatus design concepts and methods suitable for mass production. Various modifications have been successfully employed to satisfy different selections of product geometries and materials.

The wire testing tool is designed as an elongated arm having features at its first end portion suitable for wire pulling and bond pushing. This tool for wire testing can be retracted during the wire bonding processes.

In one embodiment of the invention, this retraction is accomplished by rotating the arm around an axis through its second end portion. The axis is fastened to a support structure attached to the tool head operating the bonding tool.

In another embodiment of the invention, the retraction is accomplished by rotating the arm together with the support structure, which in this case has a rotation axis in proximity to the tool head.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
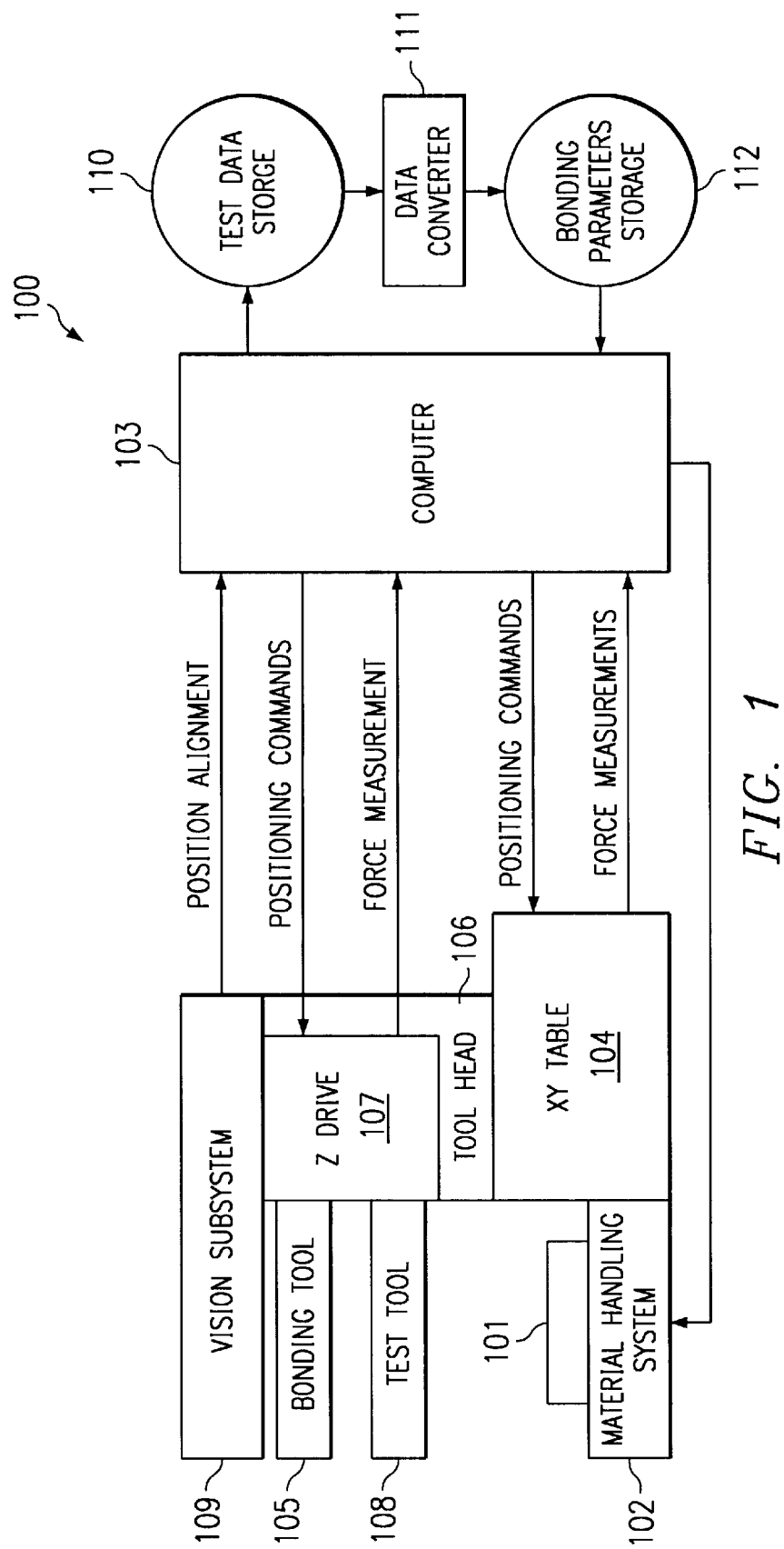
FIG. 1 illustrates a block diagram of a computer system for combining wire bonding and wire testing, and automatically correcting the bonding parameters.

As a preferred embodiment of the present invention, FIG. 1 shows a block diagram of a combined system, generally designated 100, for automatically bonding and testing wire connections attached to an integrated circuit (IC) chip and to a substrate. The chip is commonly mounted on a support (which may be part of the substrate); in FIG. 1, the mounted chip is designated 101. The mounted chip is moved in and out of the system 100 by a material handling subsystem 102, which is coupled to the computer 103 of the system. Within the system, the movements of the mounted chip 101 may be further controlled by the X-Y table 104, which is also coupled to the computer 103.

Figure 2:
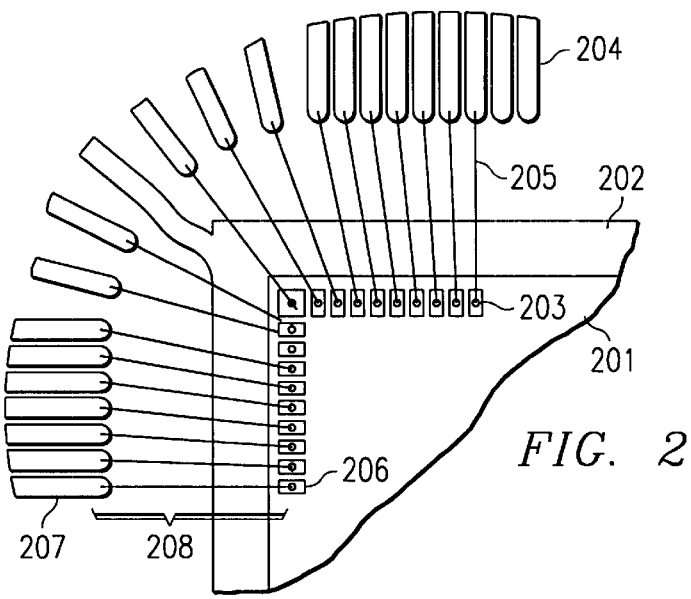
FIG. 2 is a schematic view of a portion of an integrated circuit chip mounted on a leadframe.

In more detail, FIG. 2 illustrates schematically the mounted chip in relation to the substrate and the wire bonds. The IC is fabricated into the active surface of a semiconductor chip 201 made of silicon, silicon germanium, gallium arsenide, or any other semiconductor material used in electronic device production. In the case of silicon, the thickness of the chip is typically 225 to 475 $\mu$m. Chip 201 is mounted onto support 202 (which may be part of the substrate) such that its active circuit side with the plurality of bonding pads 203 faces away from the support. The mounting is usually performed by a thin film of adhesive epoxy or polyimide (designated 209 in FIG. 3).

Bonding pads 203 are shaped as a rectangle, a square or a circle with a side length of about 40 to 150 $\mu$m, preferably 90 to 100 $\mu$m. The pitch between neighboring bonding pads is typically in the range from 50 to 200 $\mu$m, for ICs with high numbers of input/output terminals preferably between 50 and 75 $\mu$m. FIG. 2 further shows a plurality of external contact pads 204. If the substrate is a metallic leadframe, then the support 202 is the chip mount pad and the contact pads 204 are the external leads. If the substrate is a conductive pattern embedded in an insulating medium, then support 202 may be any portion of the substrate and the contact pads 204 are metallized pads integral with the substrate.

Bonding pads 203 are most frequently made of aluminum, often alloyed with 0.5 to 2% copper and/or 0.5 to 1% silicon. The metal layer is about 0.4 to 1.5 $\mu$m thick. Under the aluminum is frequently a thin (4 to 20 nm) layer of, for example, titanium, titanium nitride, titanium tungsten, tantalum, tantalum nitride, or tungsten nitride. Alternatively, bonding pads 203 may comprise copper (about 0.2 to 1.0 $\mu$m thick), covered with a thin film of bondable metal such as palladium, gold or nickel.

Wire connections 205 provide the interconnections between bonding pads 203 and contact pads 204. The wire connections are attached to the bonding pads 203 by ball bonds 206, and to the contact pads 204 by stitch bonds 207. Alternatively, the attachments may be wedge bonds on both the bonding pads and the contact pads. Between the two attachments stretches the wire span 208.

In the preferred embodiment of the invention, standard round wire of diameter between about 18 to 33 $\mu$m is used, preferably 20 to 25 $\mu$m. For bonding to aluminum pads, the wire consists of gold, with optional very small contents of beryllium, copper, palladium, iron, silver, calcium or magnesium (which are sometimes employed to control the heat-affected zone in ball formation, which would be mechanically weak for bending or other deformation stresses). For bonding to copper pads, the wire consists of copper or gold of comparable diameter.

Figure 3:
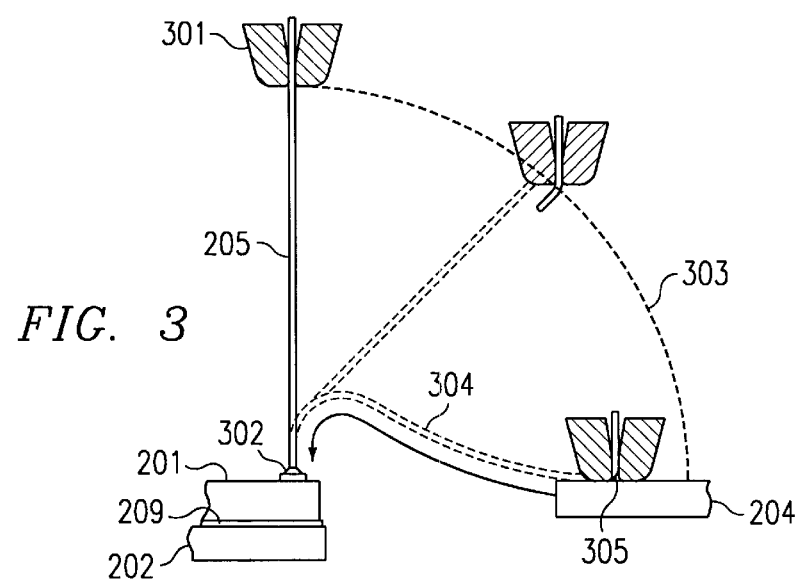
FIG. 3 is a schematic and simplified cross sectional view of a capillary tip and its motion during wire bonding operation.

In FIG. 3, the wire bonding process begins by positioning the chip 201, mounted by the adhesive layer 209 onto support 202, on a heated pedestal to raise the temperature to between 150 to 300° C. The wire 205 is strung through a capillary with tip 301. At the tip of the wire, a free air ball is created using either a flame or a spark technique. he ball has a typical diameter from about 1.2 to 1.6 wire diameters. The capillary is moved toward the chip bonding pad and the ball is pressed against the metallization of the pad, creating a so-called nailhead configuration 302. For pads of aluminum, a combination of compression force and ultrasonic energy creates the formation of gold-aluminum intermetallics and thus a strong metallurgical bond. The compression force (also called Z- or mash force) is typically between about 17 and 75 g; the ultrasonic time between about 10 and 20 ms; the ultrasonic power between about 20 and 50 mW. At time of bonding, the temperature usually ranges from 150 to 270° C. In the case of copper wire on copper pad, only metal interdiffusion takes place in order to generate the strong weld.

Moving the capillary in a predetermined and computer-controlled manner through the air will create a wire looping of exactly defined shape. For instance, the capillary tip may follow a path 303 as schematically indicated in FIG. 3 and form a natural loop 304. With recent technical advances, rounded, trapezoidal, linear and customized loop paths can be formed. Finally, the capillary reaches its desired destination 305. The capillary is lowered to touch the pad 204; with the imprint of the capillary, a metallurgical stitch bond is formed, and the wire is broken off to release the capillary. Stitch contacts are small yet reliable; the lateral dimension of the stitch imprint is about 1.5 to 3 times the wire diameter (its exact shape depends of the shape of the capillary used, such as capillary wall thickness and capillary footprint).

Alternatively, both wire ends 302 and 305 can be wedge bonded.

Recent technical advances in wire bonding allow the formation of small yet reliable ball and stitch contacts and tightly controlled shape of the wire loop 304. Such advances can, for instance, be found in the computerized bonder 8020 by Kulicke & Soffa, Willow Grove. Pa., U.S.A., or in the ABACUS SA by Texas Instruments, Dallas, Tex., U.S.A.

Referring now to FIG. 1, the capillary is part of the bonding tool 105 on the tool head 106, which is coupled the Z driver 107. The Z driver 107 and the X-Y table 104 receive their positioning commands from computer 103.

FIG. 1 further shows the testing tool 108, also coupled to the Z drive and thus to the computer 103. This testing tool is a pivotal part of the present invention; it is configured to execute the following quality tests on a completed wire connection as shown, for example, in FIG. 3 by wire span 304, ball bond 302 and stitch bond 305.

Wire Pull

The test of "Wire Pulling" measures the strength of the wire span, the quality of the stitch bond, and the performance of the bonding equipment. A testing tool, preferably shaped as a hook, is used to grasp the wire span (there are standardized rules for exact positioning of the tool) and lift it upward with increasing force, until the wire span breaks. The force needed for breakage is measured and recorded in test data storage (designated 110 in FIG. 1). However, for information about the strength of ball bonds, the wire pull test is about an order of magnitude less sensitive than the bond shear test. Faulty wire span breakage would appear at pull forces too low or at wrong places along the wire span; it would indicate wrong looping of the span, weakened wire zones due to heat or bending, or imperfect bonder performance.

Bond Shear

The test of "Bond Shearing" measures the strength of ball bonds (or wedge bonds), the quality of the intermetallics formed between the ball metal and the bonding pad metal (bond shearing is thus an indirect measure of the quality of the wafer fab process performance), and the effectiveness of the bonding parameters. A testing tool, preferably shaped as a ram with a flat contact surface, is used to push laterally against the wire ball (there are standardized rules for exact positioning of the tool) and exert increasing lateral force against the ball until the ball shears off. The force needed for shearing-off is measured and recorded in test data storage (designated 110 in FIG. 1). However, ball shearing does not measure wire or stitch bond quality.

Faulty shearing at shear forces too low or at incorrect locations would indicate insufficient intermetallic formation, lifting of pad metallization, lifting of semiconductor portions under the pad metallization, wire shear, or ball shear at wrong locations.

Figure 4A:
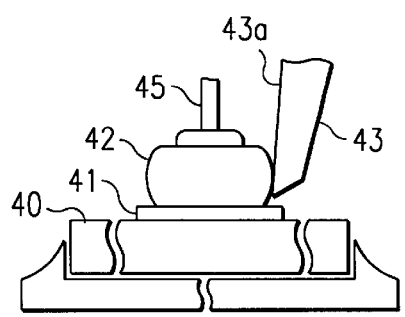
FIGS. 4A and 4B are schematic and simplified cross sectional views of a ball bond during certain phases of the bond shear quality test.
Figure 4B:
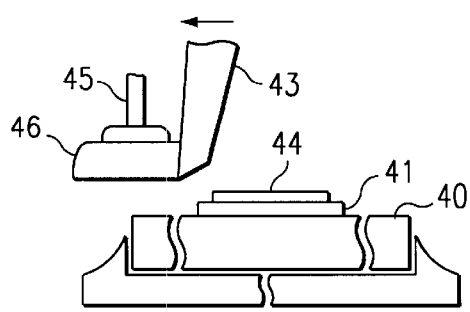

In FIGS. 4A and 4B, an IC chip 40 has bond pad metallization 41. In FIG. 4A, ball bond 42 has been formed from wire 45, including intermetallics (not shown separately) at the weld to pad metal 41. Shearing ram 43 is touching ball 42 with its flat surface 43a. In FIG. 4B, ball bond 42 has been sheared off at the ball bond weld area 44 by the shear ram 43 moving laterally; the shearing proceeds through the zone of intermetallics and thus tests the quality of the bond. The major portion 46 of ball 42 is still attached to wire 45.

Referring now to FIG. 1, the force data acquired by the wire pull test and the ball shear test are filed in the test data storage 110. Data converter 111 reads the test data and converts them into instructions for adjusting the computer control 103 of the bonding parameters for subsequent wire spans and bond attachments to be created by bonding tool 105. The corrected bonding parameters are filed in bonding parameter storage 112, coupled to computer 103. Using the corrected bonding parameters, the number of faulty bonds is reduced to near zero and bonding production down time due to off-line testing and parameter correction is substantially eliminated.

The vision subsystem 109, coupled to computer 103, serves to align the relative positions of the device to be bonded and the bonding and testing means of the tool head. It is further needed for the calibration procedure (discussed in conjunction with FIGS. 8A, 8B and 8C).

Figure 5:
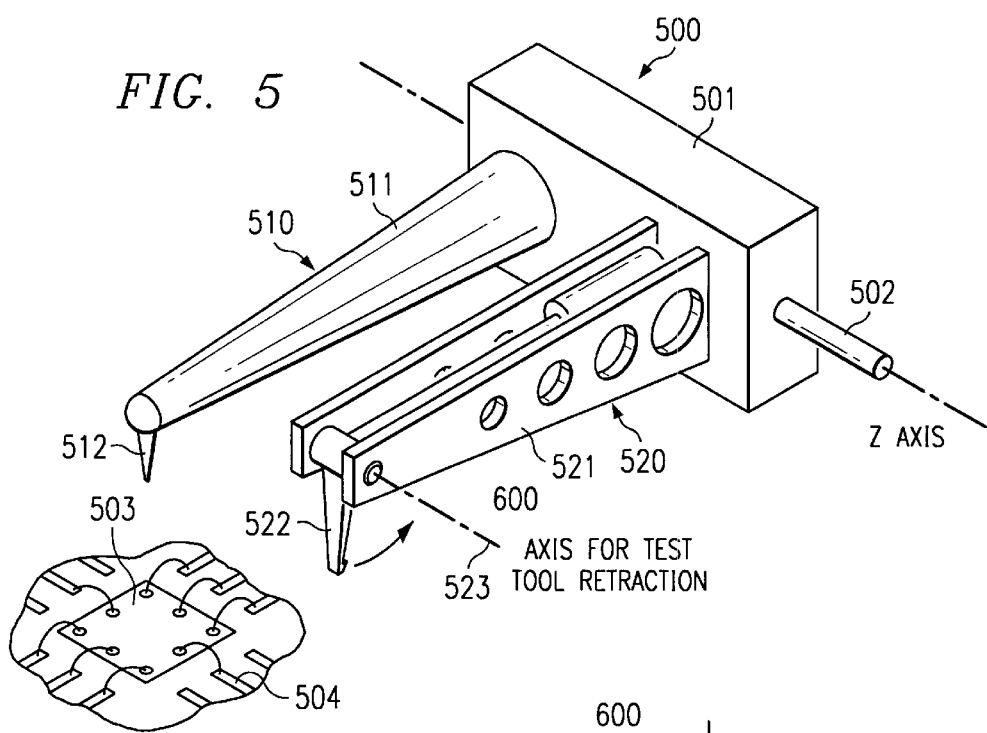
FIG. 5 is a schematic and simplified perspective view of a first embodiment of the tool head of the invention.

FIG. 5 illustrates one preferred embodiment of the tool head of the invention. The tool head, generally designated 500, has a carrier 501 rotatable around the Z axis (Z drive) 502. Attached to carrier 501 are the bonding means 510 and the testing means 520. The tool head 500 is shown in proximity to an IC chip 503, to be wire bonded to leadframe leads 504, and then to be tested for bond quality. Bonding means 510 comprise an arm 511, affixed to carrier 501, and the bonding tool 512 comprising the capillary in an appropriate support structure.

Testing means 520 comprise an arm 521, affixed to carrier 501, and the testing tool 522 attached to arm 521 such that it is rotatable around an axis. By rotating testing tool 522 around this axis, it can be retracted in order to allow the bonding tool 512 to operate freely during the wire bonding operations.

Figure 6:
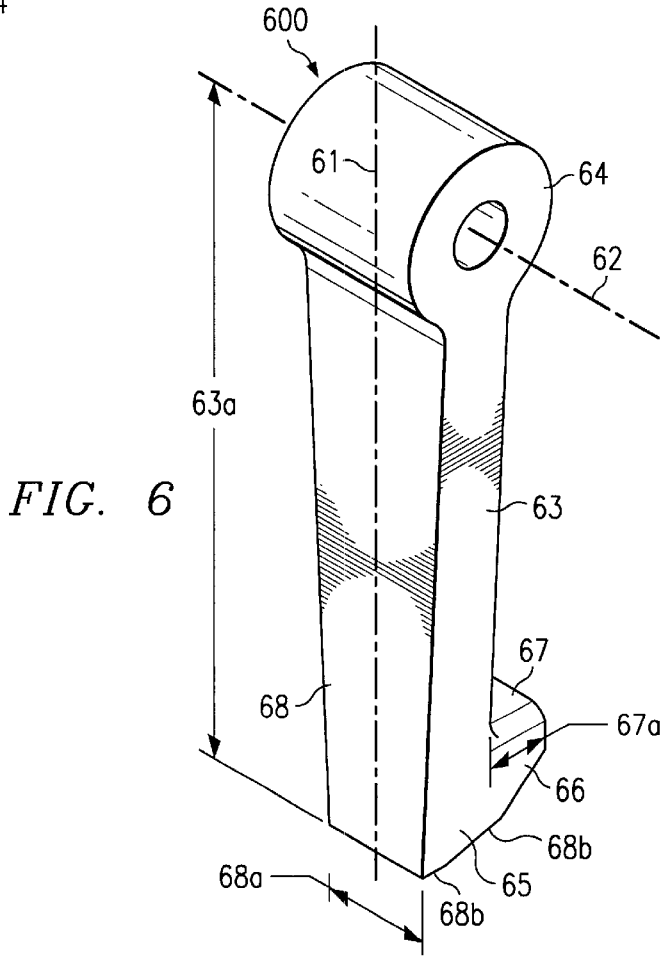
FIG. 6 is a schematic perspective view of the wire testing tool according to the invention.

FIG. 6 illustrates the testing tool 522 in more detail. The tool, generally designated 600, is shaped as an elongated arm 63 having a longitudinal axis 61. The length 63a of arm 63 is in the range from 5 to 6 mm. In the preferred embodiment, the tool is made of metal such as stainless steel or copper; it has to be hardened for low wear and has to be stiff enough for minimal deformation under wire pull and push testing conditions.

On one end 64, the tool is adapted for pivotal attachment (as shown in FIG. 5) such that it can rotate around axis 62. On the other end 65, the tool has a projection 66 which extends transversely from arm 63. In the preferred embodiment, the projection 66 extends generally perpendicular from the longitudinal axis 61 for a length 67a. In general, length 67a is dependent on the diameter of the wires-to-be-tested and the proximity of their spans. As an example, for wires of 25 µm diameter and 150 µm pitch, length 67a may be about 200 to 250 µm. The length has to be large enough to catch the wires within the X-Y positioning accuracy of the bonder, yet small enough to be dexterous in application to closely spaced wire spans. The surface 67 is contoured to grasp wire spans in wire pull tests; commonly, the surface resembles a hook. It has rounded edges to avoid nicking the wires-to-be-tested for false fails.

End portion 65 further has at least one surface 68 suitable to push against the wire bonds, especially ball bonds, in bond shear tests. For this purpose, tool 600 is operable to move vertically and laterally in order to perform the shear tests. In the preferred embodiment, surface 68 is flat so that it offers a well-defined contact surface against the wire bonds. In other embodiments, surface 68 may be rounded. The width 68a is related to the ball bond diameter; it should not be so small that it cuts through the ball, but not so large that it touches adjacent balls. Typical widths are in the range of 75 to 125 µm.

Related to the shear contact surface 68 is the bottom surface 68b of tool 600. (It should be understood by one skilled in the art that terms such as "bottom" and "end" are used for illustration purposes only, as the apparatus and assembly of the invention can be used in a variety of positions and ways). The shape of this surface provides for detection of positive touchdown without excessive tool wear and for facility in driving projection 67 between the wires. The flatness of bottom surface 68b facilitates touching the surface without digging into it, and the bevel permits pushing of the wires without breaking them.

Figure 7A:
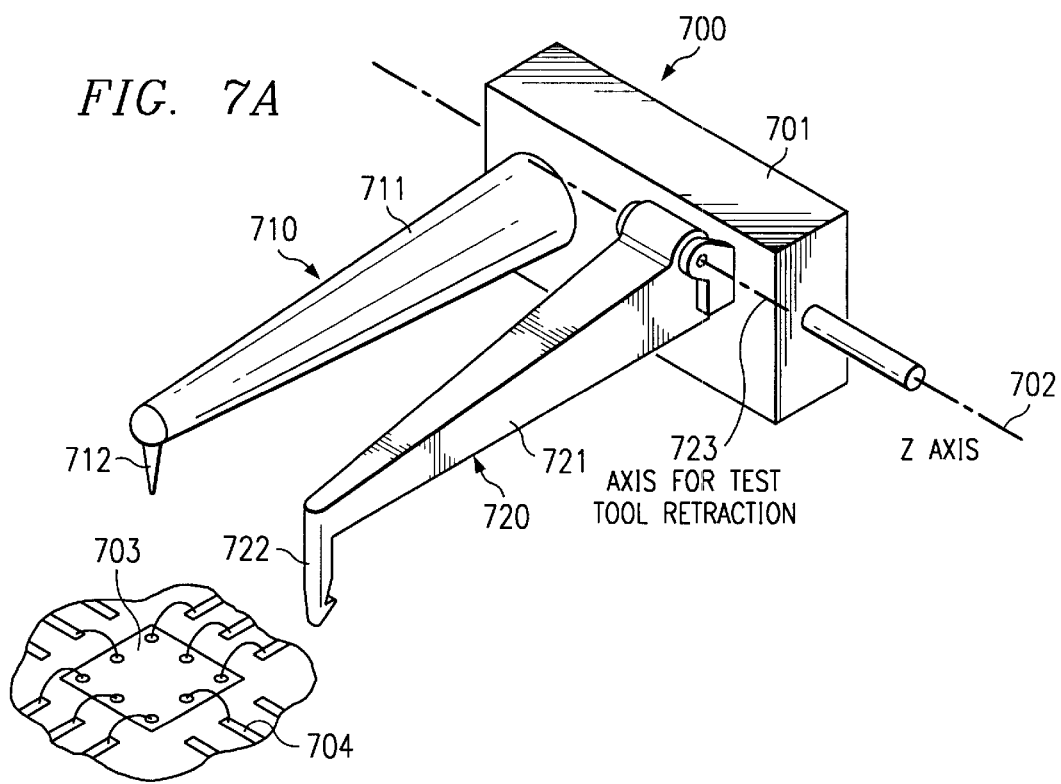
FIGS. 7A and 7B are schematic and simplified perspective views of a second embodiment of the tool head of the invention.
Figure 7B:
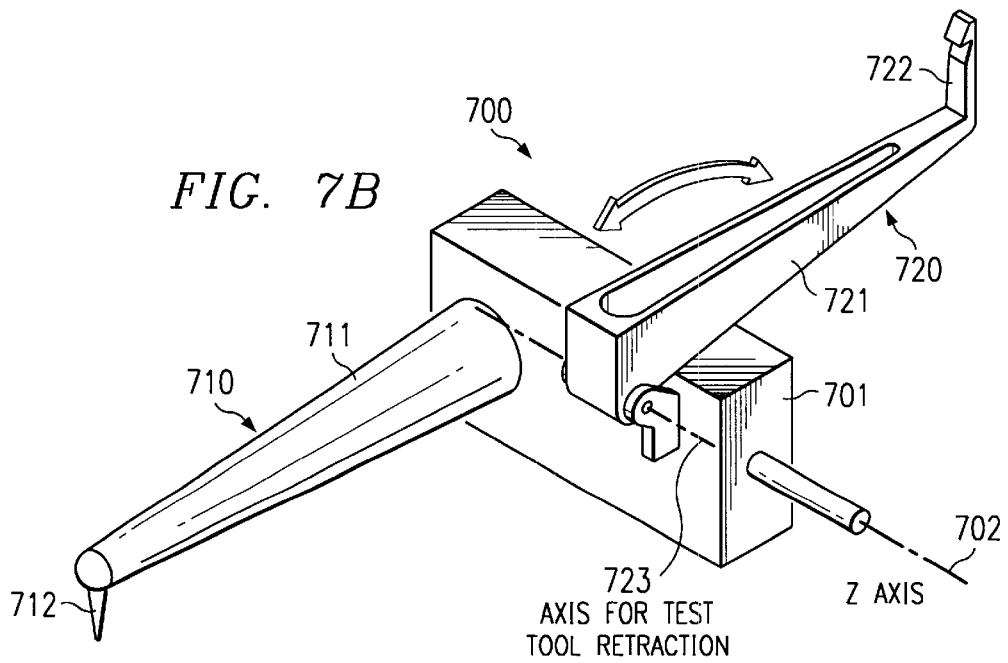

FIGS. 7A and 7B illustrate another embodiment of the invention in the arrangement of the tool head generally designated 700. The tool head has a carrier 701 rotatable around the Z axis (Z drive) 702. Attached to carrier 701 are the bonding means 710 and the testing means 720. In FIG. 7A, the toll head 700 is shown in proximity to an IC chip 703 to be wire bonded to lead frame leads 704 and tested for bond quality. Bonding means 710 comprise an arm 711, affixed to carrier 701, and the bonding tool 712 comprising the capillary in an appropriate support structure.

Testing means 720 comprise an arm 721 rotatable around an axis 723 for retracting testing means 720 to allow the bonding tool 712 to operate freely during the wire bonding operations. The actual testing tool 722 is affixed to arm 721. FIG. 7A illustrates the test position of arm 721, and FIG. 7B illustrates the position of arm 721 during bonding operations. The advantage of the embodiment shown in FIGS. 7A and 7B compared to the embodiment shown in FIG. 5 is a lower rotational inertia during bonding, the drawback is a larger required clearance space for the tool retraction.

The options for actuating the retraction shown in FIG. 7B include a solenoid, a piezo stack, a micro-rotary motor, and an air cylinder.

The method for computer-controlled bonding and testing of the wire connections between the IC chip and the substrate (for instance, leadframe), as illustrated in FIGS. 5 and 7A and 7B, and for automatically adjusting the bonding parameters in response to the testing, is exemplified by the process steps of:

Forming the wire connections between the chip and the substrate under computer control as described above in conjunction with FIG. 3, resulting in creating ball and stitch attachments and a wire span while the testing tool is in retracted position;

moving the bonding tool into test configuration by
tilting Z axis upward to get bonding tool clear of testing area; and
moving X and Y positioning system by a calibrated offset to provide clearance for the test tool touchdown;

performing several X-Y passes through the test area to establish nominal "no-load" force measurements;

rotating testing tool into testing position;

performing Z axis touchdown calibration with testing tool;

raising Z axis by programmed amount for shear testing;

using X-Y axis, driving test tool to shear wire ball while recording the electrical current as test data;

calculating the shear force from electrical current data;

reversing roles of Z and X-Y axes for wire pull testing in subsequent wire connection; i.e., applying X-Y axis for positioning tool for testing and Z axis for moving tool during test measurements; and automatically adjusting the bonding parameters of subsequent wire connections responsive to the test data.

Figure 8A:
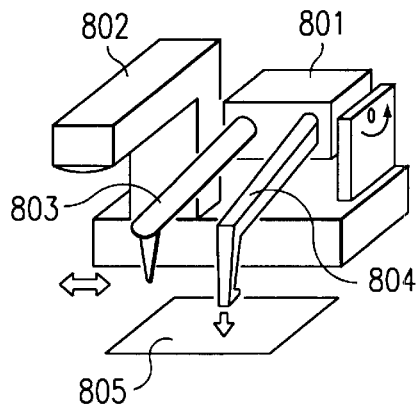
FIGS. 8A, 8B, and 8C are schematic and simplified perspective views of the tool head and the vision subsystem during certain phases of the calibration process according to the invention.
Figure 8B:
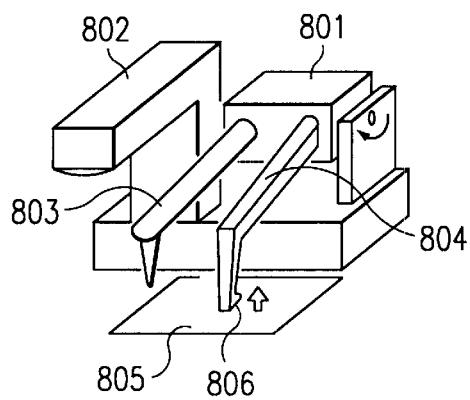
Figure 8C:
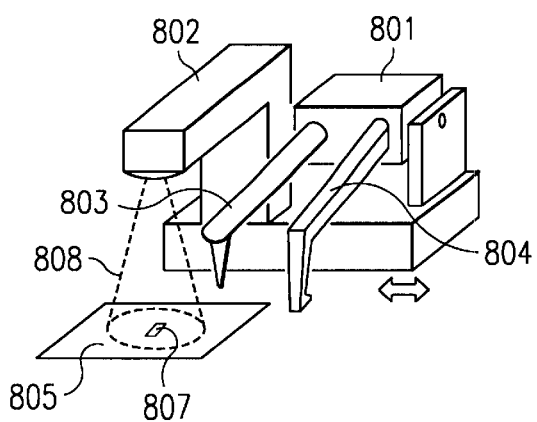

FIGS. 8A, 8B, and 8C illustrate steps of the calibration process for the testing means. Shown are perspective views of the tool head 801 and the vision subsystem 802. Attached to the tool head 801 are the bonding tool 803 and the testing tool 804. The testing tool is shown over a metallized testing surface 805, which may be an actual chip bonding pad or a general mirror-like surface with metal hardness characteristics similar to the aluminum typically employed in IC production. Using the support of the motion arrows in FIGS. 8A, 8B and 8C, the sequence of calibration process steps is as follows:

Putting the tool head 801 in testing configuration;

positioning the test tool 804 over test area 805 such that its end with the transverse projection faces area 805;

automatically recording the associated X-Y position of the X-Y table;

using the Z drive to bring test tool 804 into contact with surface 805 (position 806 in FIG. 8B);

automatically recording the associated Z position of the Z drive;

using the Z drive to apply sufficient pressure with testing tool 804 to create a visible mark 807 in area 805 (representing the bottom surface 68b of tool 600 in FIG. 6);

raising the test tool 804 above surface 805;

using X-Y table, moving the field of view 808 of vision subsystem 802 to approximate the location of the tool mark 807(see FIG. 8C);

automatically recording X-Y position;

using vision subsystem, determining precise location of features of tool mark 807;

repeating all calibration process steps employing bonding tool 803 rather than testing tool 804; and automatically calculating the precise relative positions of bonding tool 803, testing tool 804, and vision subsystem 802.

While this invention has been described in reference to illustrative embodiments, this description is not intended to be construed in a limiting sense. Various modification and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the advanced bonders may include equipments such as the Shinkawa UTC-200, manufactured by Shinkawa Electric Company Ltd., Tokyo, Japan. It is therefore intended that the appended claims encompass any such modifications or embodiments.

I claim:

1. A combined system for automatically bonding and testing wire connections attached to an integrated circuit chip having at least one bonding pad and to a substrate having at least one contact pad remote from said bonding pad, comprising:
- a computer to control said bonding and testing;
- a wire bonder operable to extend a wire span from said bonding pad to said contact pad, and to create wire attachments onto both said pads, said bonder following instructions from said computer;
- an X-Y table, in combination with said bonder, suitable to position said chip mounted onto said substrate;
- means controlled by said computer for adjusting the relative positions of said bonder and said table, one to the other;
- a testing apparatus in combination with said bonder, operable to exert forces controlled by said computer for testing the bonding quality, and to store the data of said testing in test files; and
- a data converter, coupled to receive said test data, operable to convert said data into instructions for adjusting the computer control of the bonding parameters for subsequent wire bond spans and attachments to be created by said bonder, whereby the number of faulty bonds is reduced to near zero and bonding production downtime is substantially eliminated.

2. The system according to claim 1 further comprising a vision subsystem, coupled to said computer, for electronically sensing the relative locations of said integrated circuit chip, said connecting wire and said testing apparatus.

3. The system according to claim 1 wherein said substrate is a leadframe for use with semiconductor circuits.

4. The system according to claim 1 wherein said substrate comprises a conductive pattern embedded in an insulating medium.

5. The system according to claim 1 wherein said attachments comprise ball bonds, stitch bonds, and wedge bonds.

6. The system according to claim 1 wherein said bonding parameters and said computerized instructions comprise geometrical position for attachment; impact velocity of and contact force of bonding tool; dwell time and ultrasonic energy during bond formation; and operating temperature.

7. The system according to claim 1 wherein said adjusting of the relative positions is provided by said table moving under computer control.

8. The system according to claim 1 wherein said adjusting of the relative positions is provided by said bonder moving under computer control.

9. The system according to claim 1 wherein said testing for bonding quality comprises applying forces for pulling said wire spans and pushing said wire attachments comprising ball bonds, stitch bonds, and wedge bonds.

10. A method for computer-controlled bonding and testing of wire connections between integrated circuit chips and substrates, and for automatically adjusting the bonding parameters in response to said testing, comprising the steps of:
- forming a wire connection between said chip and said substrate under computer control to create wire attachments and a wire span;
- testing said wire connection automatically under computer control to generate test data; and
- automatically adjusting the bonding parameters of subsequent wire connections responsive to said test data, whereby the number of faulty bonds is reduced to near zero and bonding production downtime is substantially eliminated.

11. The method according to claim 10 wherein said wire bonding and testing is achieved with a tool head comprising means for creating bonds and means for quality testing of bonded wires, said tool head being attached to an X-Y table coupled to said computer, and said bonding means and testing means being attached to a Z driver.

12. The method according to claim 11 wherein said computer-controlled wire bonding comprises the steps of:
- lowering said bonding means to contact the chip bonding pad and form a ball bond;
- raising and laterally moving said bonding means to create a wire span; and
- lowering said bonding means to contact the substrate contact pad and form a stitch bond.

13. The method according to claim 11 wherein said computer-controlled wire bonding comprises the steps of:
- lowering said bonding means to contact the chip bonding pad and forming a wedge bond;
- raising and laterally moving said bonding means to create a wire span; and
- lowering said bonding means to contact the substrate contact pad and form a wedge bond.

14. The method according to claim 12 wherein said lowering and raising of said bonding means is provided by a Z driver coupled to said computer, and wherein said lateral moving of said bonding means is provided by an X-Y table coupled to said computer.

15. The method according to claim 11 wherein said computer-controlled testing comprises the steps of:
- lowering said testing means and grasping said wire span;
- raising said testing means and pulling said span until breaking said wire;
- recording the force necessary to initiate said wire breaking;
- lowering said testing means and laterally pushing against said wire attachment until shearing off said attachment; and
- recording the force necessary to initiate said attachment shearing.

16. The method according to claim 15 wherein said lowering and raising of said testing means is provided by a Z driver coupled to said computer, and said lateral pushing of said testing means is provided by an X-Y table coupled to said computer.

17. The method according to claim 11 further comprising the step of retracting said testing means while the step of forming said wire connection is being performed.

18. The method according to claim 10 wherein said step of forming wire connections is repeated a plurality of times before the subsequent steps of testing said wire connections and generating said test data are performed, so that said adjusting of the bonding parameters is based on statistical test data.

19. The method according to claim 15 wherein the steps of pulling the wire span and pushing the wire attachment are performed on separate populations of wire connections.

20. An apparatus to automatically bond wire connections between bonding pads on integrated circuit chips and contact pads on substrates, and to test the quality of said connections, comprising:
- a computer to control said bonding and testing;
- a tool head in combination with positioning means coupled to said computer;
- a first tool, coupled to said tool head, operable to create said bond wire connections; and
- a second tool, coupled to said tool head, operable to test said quality of said connections by pulling wires spanning between said bonding pads on said integrated circuit chips and said contact pads on said substrates.

21. The apparatus according to claim 20 wherein said positioning means comprise an X-Y table and a Z driver.

22. The apparatus according to claim 20 wherein said wire connections comprise the attachments of ball bonds, stitch bonds, and wedge bonds, and the extension of a wire span.

23. The apparatus according to claim 20 wherein said first tool is a bonding tool comprising a capillary and a wedge tool.

24. The apparatus according to claim 20 wherein said second tool is a mechanical arm suitable for exerting forces in X, Y, and Z directions.

25. An apparatus for attachment to a wire bonder, for quality testing of bonded wires created in the assembly of integrated circuits, comprising:

an elongated arm having a longitudinal axis and first and second end portions;

said first end portion being adapted for pivotal attachment to said bonder;

said second end portion having a projection extending transversely therefrom and generally perpendicular to said longitudinal axis, further having a surface contoured to grasp wire spans in wire pull tests;

said second end portion further having at least one surface suitable to push against said wire bonds in bond shear tests; and said arm operable to move vertically and laterally to perform said tests.

26. The apparatus according to claim 25 wherein said testing apparatus is rotatable around an axis in order to provide for retracting said arm during wire connections.

27. The apparatus according to claim 26 wherein said axis is positioned in said first end portion of said arm.

28. The apparatus according to claim 26 wherein said axis is positioned in proximity to said bond head.

29. The apparatus according to claim 25 wherein said at least one surface of said second end portion suitable for pushing is a flat surface.

* * * * *